United States Patent
Yamazaki et al.

[11] Patent Number: 5,981,371
[45] Date of Patent: Nov. 9, 1999

[54] BUMP FORMING METHOD

[75] Inventors: Nobuto Yamazaki, Kunitachi; Motohiko Kato, Higashikurume, both of Japan

[73] Assignee: Kabushiki Kaisha Shinkawa, Tokyo, Japan

[21] Appl. No.: 08/814,799

[22] Filed: Mar. 10, 1997

[30] Foreign Application Priority Data

Mar. 15, 1996 [JP] Japan .................................. 8-087609

[51] Int. Cl.$^6$ .................................................. H01L 21/44
[52] U.S. Cl. ...................... 438/617; 438/612; 228/180.5
[58] Field of Search .................... 438/612, 613, 438/617; 257/737, 738, 784; 228/180.5

[56] References Cited

U.S. PATENT DOCUMENTS

| | | | |
|---|---|---|---|
| 5,014,111 | 5/1991 | Tsuda et al. ............................. | 438/617 |
| 5,124,277 | 6/1992 | Tsumura ................................. | 438/617 |
| 5,176,310 | 1/1993 | Akiyama et al. ...................... | 228/180.5 |
| 5,485,949 | 1/1996 | Tomura et al. ........................ | 228/180.5 |
| 5,559,054 | 9/1996 | Adamjee ................................ | 438/617 |
| 5,686,353 | 11/1997 | Yagi et al. .............................. | 438/617 |
| 5,740,956 | 4/1998 | Seo et al. ................................. | 438/617 |
| 5,857,610 | 11/1995 | Hoshiba et al. ........................ | 228/246 |
| 5,894,983 | 4/1999 | Beck et al. ............................. | 228/180.5 |
| 5,897,049 | 4/1999 | Nakamura et al. .................... | 228/180.5 |

FOREIGN PATENT DOCUMENTS

| | | | |
|---|---|---|---|
| 54-2662 | 1/1979 | Japan .............................. | H01L 23/48 |
| 4-41519 | 7/1992 | Japan .............................. | H05K 3/24 |

*Primary Examiner*—Kevin M. Picardat
*Attorney, Agent, or Firm*—Koda & Androlia

[57] ABSTRACT

In a ball forming method used in manufacturing semiconductor devices, a ball is formed at the end of a bonding wire, this ball is pressed against an electrode of a semiconductor device and bonded to the electrode, a capillary is raised by a predetermined amount, and an ultrasonic vibration is applied to the capillary so that a portion of the wire located between the bonded ball and the lower end of the capillary is caused to undergo resonant vibration. This resonant vibration separates the wire from the bonding ball, thus leaving the ball on the electrode as a bump.

10 Claims, 1 Drawing Sheet

BUMP FORMING METHOD

BACKGROUND OF THE INVENTION

1. Field of the Invention

The present invention relates to a method for forming bumps on the electrodes of semiconductor devices.

2. Prior Art

Conventional methods which use a wire bonding apparatus to form bumps on the electrodes of semiconductor devices are disclosed in, for example, Japanese Patent Application Laid-Open (Kokai) No. 54-2662 and Japanese Patent Application Publication (Kokoku) No. 4-41519.

In the method disclosed in Japanese Patent Application Laid-Open (Kokai) No. 54-2662:

- a ball is formed by an electrical discharge, etc., on a wire that passes through the capillary of a wire bonding apparatus,
- the capillary is lowered so that the ball is pressed against one of the electrodes of a semiconductor device and bonded thereto,
- the capillary is raised slightly,
- a clamper is closed so as to clamp the wire, and
- the capillary and clamper are both raised so that the ball is separated from the wire and the ball remains on the surface of the electrode as a bump.

In the method disclosed in Japanese Patent Application Publication (Kokoku) No. 4-41519, the same operation is employed as in the above-identified prior art including the formation of the ball and the pressing and bonding of the ball to the electrode. However, after the ball has been pressed against the electrode and bonded to the electrode,

- the capillary is raised and moved a slight distance in the horizontal direction and is then again lowered, thus forming a weak portion in the wire,
- the capillary is raised again,
- the clamper is closed so as to clamp the wire, and the capillary and clamper are raised so that the ball is separated from the wire and remains on the surface of the electrode as a bump.

In the first method described above, a bump is formed merely by raising the capillary and cutting the wire (for separating the ball) after the ball has been pressed against the electrode and bonded. Thus, the length of a minute projection remaining on the upper surface of the bump tends to be long. Furthermore, since the cutting (or separating) position of the ball is not consistent, the length of the minute projection tends to vary greatly.

In the second method described above, an operation in which the capillary is raised, moved horizontally and then again lowered needs to be performed after the ball has been pressed against the electrode and bonded. Thus, this method is inferior in terms of productivity despite the fact that productivity is a very important element in semiconductor manufacturing.

SUMMARY OF THE INVENTION

Accordingly, the object of the present invention is to provide a bump forming method in which the minute projection can be short, the minute projection can be consistent in length, and the productivity is high.

The object is accomplished by a first unique method of the present invention wherein:

- a ball is formed on a wire that passes through a capillary,
- the ball is pressed against an electrode on a semiconductor device and bonded thereto,
- the capillary is raised by a predetermined amount, and
- an ultrasonic vibration is applied to the capillary so as to resonate the wire extending from the lower end of the capillary to the bonded ball, thus causing the wire to be cut at the bonded ball, thereby forming a bump on the electrode.

The object is accomplished by a second unique method of the present invention that uses a wire bonding apparatus which includes a first clamper that moves vertically together with a capillary and a second clamper that is immovable in the vertical direction, wherein:

- a ball is formed on a wire which passes through the capillary with the first clamper closed;
- the first clamper is opened and the ball is pressed against an electrode on a semiconductor device and bonded thereto,
- the capillary is then raised by a predetermined amount,
- the second clamper is closed so that the wire is clamped, the timing of the second clamper to be closed being immediately prior to the raising of the capillary, at an intermediate point during the raising motion of the capillary, after the raising of the capillary, or simultaneously with the raising of the capillary,
- an ultrasonic vibration is applied to the capillary so that the wire is cut at the bonded ball, thus forming a bump on the electrode, and
- the first clamper and capillary are lowered so that the length of wire extending from the lower end of the capillary is adjusted so as to have a tail length which is required for ball formation.

The object is accomplished by a further unique method of the present invention wherein the distance in which the capillary is raised by a predetermined amount following the bonding of the ball in the above two methods is equal to the length of wire extending from the bonded ball to the lower end of the capillary so as to undergo resonant vibration by the ultrasonic vibration applied to the capillary.

The object is accomplished by a still further unique method of the present invention wherein the ultrasonic vibration is applied to the capillary in the above first and second methods after the capillary has been moved by an amount equal to or greater than the gap between the wire and a wire passage hole formed in the capillary.

DETAILED DESCRIPTION OF THE INVENTION

Figure 1A:
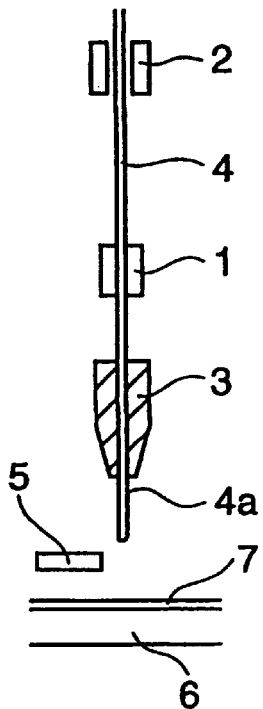
FIGS. 1(*a*) through 1(*f*) explanatory diagrams illustrating one embodiment of the bump forming method according to the present invention.

The embodiment of the present invention will be described with reference to, as an example, a wire bonding apparatus which includes two clampers, a first clamper 1 and a second clamper 2; and the first clamper 1 moves upward and downward (or vertically) together with the capillary 3, while the second clamper 2 does not move either upward nor downward, thus being immovable. Furthermore, a wire 4 passes through a wire passage hole formed axially in the capillary 3, and a ball 4*b* is formed by an electrical torch 5 at the end of a tail length portion 4*a* of the wire 4 which extends from the lower end of the capillary 3. Moreover, the capillary 3 is attached to the tip part of an ultrasonic horn which has an ultrasonic oscillation source (not shown).

Figure 1B:
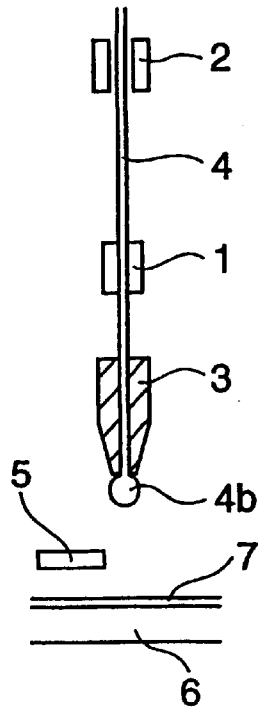

First, with the first clamper 1 closed as shown in FIG. 1(*a*), a high voltage is applied by the electrical torch 5 to the tip end of the tail length portion 4a of the wire extending from the lower end of the capillary 3; as a result, a ball 4b is formed at the end of the wire 4 as shown in FIG. 1(b).

Figure 1C:
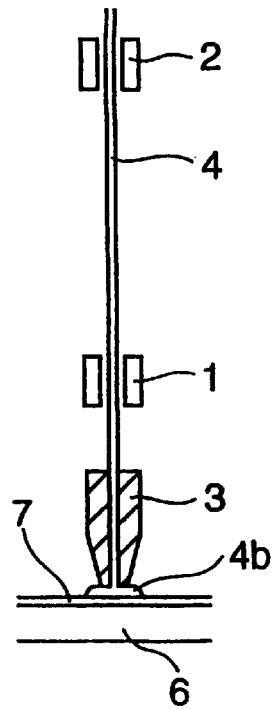

Next, the first clamper 1 is opened, and the capillary 3 is lowered so that the ball 4b is pressed against an electrode 7 of a semiconductor device 6 and bonded to the electrode 7 as shown in FIG. 1(c).

Figure 1D:
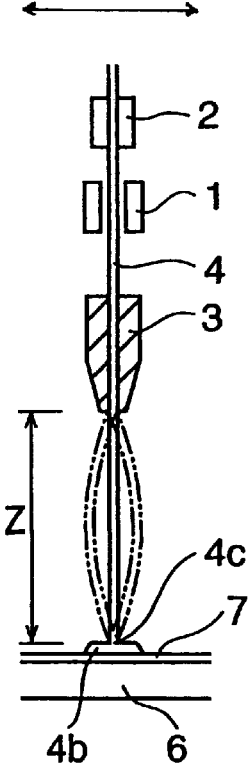

Then, as shown in FIG. 1(d), the second clamper 2 is closed, and the first clamper 1 and capillary 3 are raised by a fixed amount Z, e. g., an amount in the range of 0.5 to 1.5 mm.

This amount (or length) Z, by which the capillary 3 is raised (i. e., the length Z of the wire 4 between the bonded ball 4b and the lower end of the capillary 3), corresponds to the wire that undergoes resonant vibration when the ultrasonic horn (not shown) to which the capillary 3 is attached is caused to undergo ultrasonic oscillation (described below). This amount by which the capillary 3 is raised, that corresponds to the resonating wire length Z, may vary depending upon the diameter, material of the wire 4, the strength and amplitude of the ultrasonic oscillation to be applied is determined by experiment beforehand.

As shown in FIG. 1 (d), after the first clamper 1 and capillary 3 have been raised by the predetermined amount Z (in order to effect resonant vibration), the ultrasonic horn (not shown) is caused to undergo ultrasonic oscillation for a predetermined period of time. The ultrasonic vibration of the ultrasonic horn is transmitted to the wire 4 through the capillary 3. As a result, the portion of the wire having the length Z (located between the bonded ball 4b and the capillary 3) undergoes resonant vibration, and since the area of the ball 4b and root portion 4c of the wire 4 has been weakened by thermal energy that occurred when the ball 4 is formed by the torch 5, the resonant vibration of the wire length Z causes the wire 4 to be cut at the root portion 4c thereof as shown in FIG. 1(e), thus separating bonded ball 4b from the wire 4. As a result, a bump 8 is formed and remains on the surface of the electrode 7.

The diameter of the wire passage hole of the capillary 3 is approximately 10 to 20 microns greater than the diameter of the wire 4. Accordingly, it is preferable that the ultrasonic horn, in other words, the capillary 3 attached thereto, is moved in the Y (horizontal) direction which is at right angles with respect to the axis of the capillary 3 as shown by an arrow in FIG. 1(d) by an amount equal to or greater than the gap between the wire 4 and the wire passage hole of the capillary 3 prior to the application of ultrasonic vibration (and then a vibration is applied via the ultrasonic horn). With this movement of the ultrasonic horn and therefore the capillary 3, the ultrasonic vibration of the capillary 3 can be efficiently transmitted to the wire 4.

As seen from the above, in the present invention, the capillary 3 is raised after the bonding of the ball 4b to an object so that the length Z of resonant vibration is set on a portion of the wire that extends from the bonded ball 4b to the lower end of the capillary 3, and then the wire 4 is cut by applying an ultrasonic vibration to the capillary 3. Accordingly, the minute projection 8a that is formed and remains on the upper surface of the bump 8 can be extremely small (or the length thereof can be very short). Furthermore, the position where the wire 4 is cut can be consistent, and the variation in the length of the minute projection 8a can be small. Moreover, unlike the prior art wherein capillary 3 is raised, moved horizontally and then moved down after bonding the ball to the electrode, the capillary 3, in the present invention, is raised and then the ultrasonic vibration is applied to the capillary 3 after bonding of the ball 4b to the electrode 7 has been completed. Accordingly, the operating time can be short, increasing the productivity.

Figure 1E:
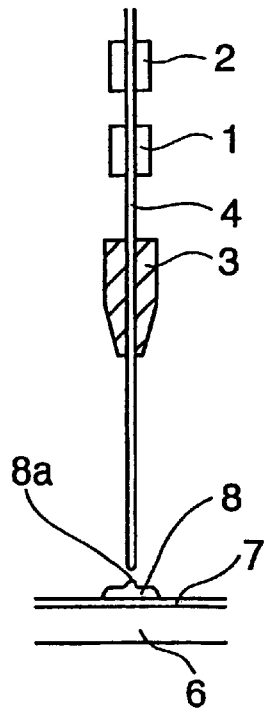
Figure 1F:
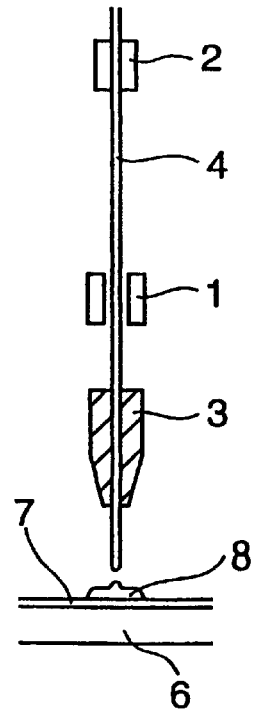

Furthermore, once the root portion 4c of the wire 4 has been cut by the resonant vibration of the wire that has the length Z for a predetermined period of time as shown in FIG. 1(e), the first clamper 1 (opened) and capillary 3 are lowered as shown in FIG. 1(f) so that the wire extending from the lower end of the capillary 3 is set so as to have the tail length 4a which is required for the formation of the ball 4b.

Then, the first clamper 1 is closed and the second clamper 2 is opened, and the first clamper 1 and capillary 3 are both raised to the ball formation level which is shown in FIG. 1(a).

In the process shown in FIG. 1(d), the first clamper 1 and capillary 3 are raised after the second clamper 2 has been closed. However, it can be arranged so that the second clamper 2 is closed: at an intermediate point during the raising process of the first clamper 1 and capillary 3, after the raising process of the first clamper 1 and capillary 3, or simultaneously with the raising process of the first clamper 1 and capillary 3.

As seen from the above, according to the present invention, a ball is formed on a wire, the ball is pressed against an electrode of a semiconductor device and bonded to the electrode, the capillary is then raised by a predetermined amount, and an ultrasonic vibration is applied to the capillary so that the portion of the wire between the bonded ball and the lower end of the capillary is caused to undergo resonant vibration, thus separating the wire from the bonded ball and leaving a bump that is formed from the pressed ball on the electrode. Accordingly, the length of the minute projection on the bump is extremely small, the length of the minute projection is consistent, and the productivity is high.

We claim:

1. A bump forming method comprising the steps of:

forming a ball on a wire that passes through a capillary, pressing said ball against an electrode of a semiconductor device so that said ball is bonded to said electrode, raising said capillary by a predetermined amount, and applying an ultrasonic vibration to said capillary so as to resonate a portion of said wire located between said ball bonded and a lower end of said capillary, thus separating said wire from said ball bonded, thus forming a bump on said electrode.

2. A bump forming method in a wire bonding apparatus which includes a first clamper that is movable in a vertical direction together with a capillary and a second clamper that is immovable in a vertical direction, said method comprising the steps of:

forming a ball on a wire which passes through said capillary while said first clamper is closed;

opening said first clamper and pressing said ball against an electrode of a semiconductor device, thus bonding said ball to said electrode;

raising said capillary by a predetermined amount, closing said second clamper so as to clamp said wire, said second clamper being closed at one timing selected from the group consisting of immediately before said raising step of said capillary, at an intermediate point during said raising step of said capillary, after said raising step of said capillary, and simultaneously with said raising step of said capillary, applying an ultrasonic vibration to said capillary so as to separate said wire from said ball bonded to said electrode, thus forming a bump on said electrode, and lowering said first clamper and said capillary until a portion of said wire located below said capillary has a tail length which is required for forming a ball.

3. A bump forming method according to claim 1 or 2, wherein a distance by which said capillary is raised by said predetermined amount following said bonding step of said ball is equal to a length of a portion of said wire that is caused to undergo resonant vibration by said ultrasonic vibration applied to said capillary.

4. A bump forming method according to claim 1 or 2, wherein said ultrasonic vibration is applied to said capillary after said capillary is moved in a direction which is at right angles with respect to an axis of said capillary.

5. A bump forming method according to claim 4, wherein said capillary is moved by an amount equal to a gap between said wire and a wire passage hole formed in said capillary.

6. A bump forming method according to claim 4, wherein said capillary is moved by an amount greater than a gap between said wire and a wire passage hole formed in said capillary.

7. A bump forming method used in a wire bonding apparatus which includes a first clamper that is movable in a vertical direction together with a capillary and a second clamper that is immovable in a vertical direction, said method comprising the steps of:

forming a ball at one end of a wire which passes through a wire passage hole formed axially in said capillary;

lowering said capillary so as to press said ball against an object and bonding said ball to said object;

raising said capillary by a predetermined amount, and applying an ultrasonic vibration to said capillary so that a portion of said bonding wire located between said ball bonded and said capillary is caused to undergo resonant vibration until said ball bonded is separated from said one end of said wire, thus forming a bumb on said object.

8. A bump forming method according to claim 7, wherein said ultrasonic vibration is applied to said capillary after said capillary is moved in a direction which is at right angles with respect to an axis of said capillary.

9. A bump forming method according to claim 8, wherein said capillary is moved by an amount equal to a gap between said wire and said wire passage hole of said capillary.

10. A bump forming method according to claim 8, wherein said capillary is moved by an amount greater than a gap between said wire and said wire passage hole of said capillary.

* * * * *